Figure 1:
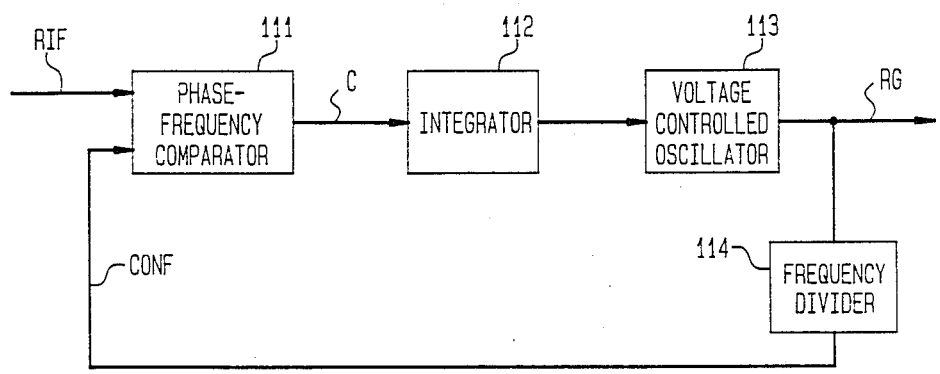

United States Patent [19]

Viti

[11] Patent Number: 4,772,852

[45] Date of Patent: Sep. 20, 1988

[54] PHASE-FREQUENCY COMPARATOR FOR PHASE-LOCKED LOOPS

[75] Inventor: Maurizio Viti, Carate Brianza, Italy

[73] Assignee: GTE Telecommunicazioni, S.p.A., Milan, Italy

[21] Appl. No.: 927,579

[22] Filed: Nov. 6, 1986

[30] Foreign Application Priority Data

Dec. 19, 1985 [IT] Italy .............................. 23293 A/85

[51] Int. Cl.[4] .......................................... G01R 25/08
[52] U.S. Cl. .................................. 328/134; 331/1 A
[58] Field of Search ............... 328/133, 134; 307/511, 307/526, 527, 528; 331/1 A

[56] References Cited

U.S. PATENT DOCUMENTS

| 3,599,102 | 8/1971 | Mous | 328/133 |
| 3,849,671 | 11/1974 | Molack | 328/133 |
| 4,123,704 | 10/1978 | Johnson | 328/134 |
| 4,339,731 | 7/1982 | Adams | 331/1 A |
| 4,668,917 | 5/1987 | Levine | 328/133 |

Primary Examiner—John S. Heyman
Attorney, Agent, or Firm—Jeffrey P. Morris

[57] ABSTRACT

An instantaneous comparison unit with an associated sequential state logic circuit is described which functions to maintain a condition of phase locking with a reference signal which is substantially immune to disturbances which cause losses or additions of signal fronts. Continuous phase shifting conditions during the transient, which precedes phase locking, is detected and compensated for by the disclosed circuit.

6 Claims, 8 Drawing Sheets

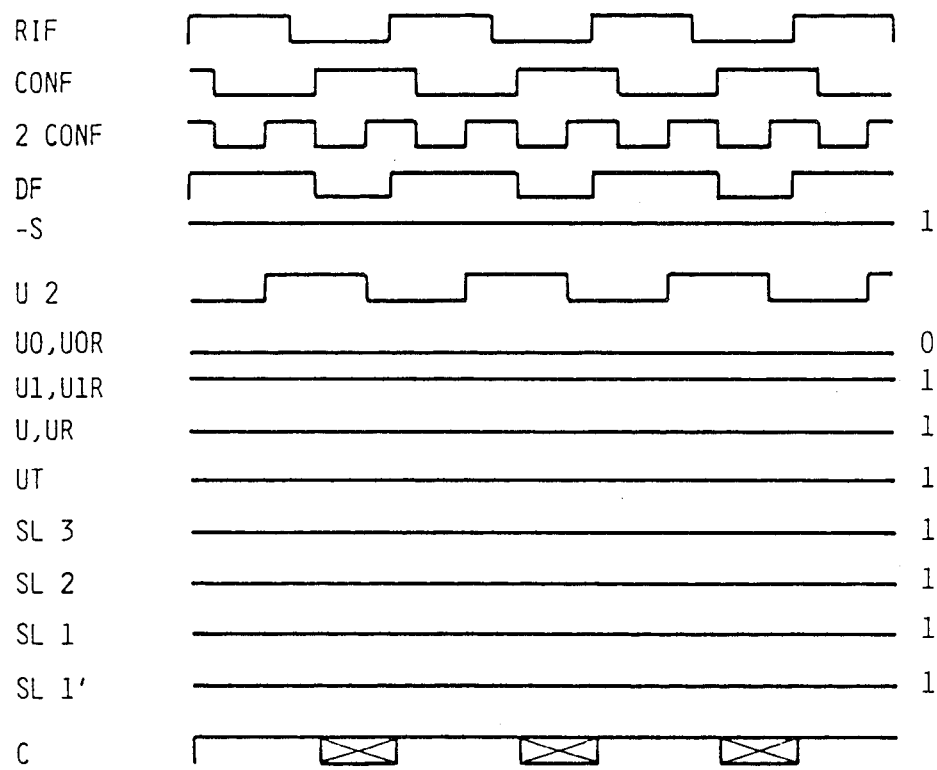

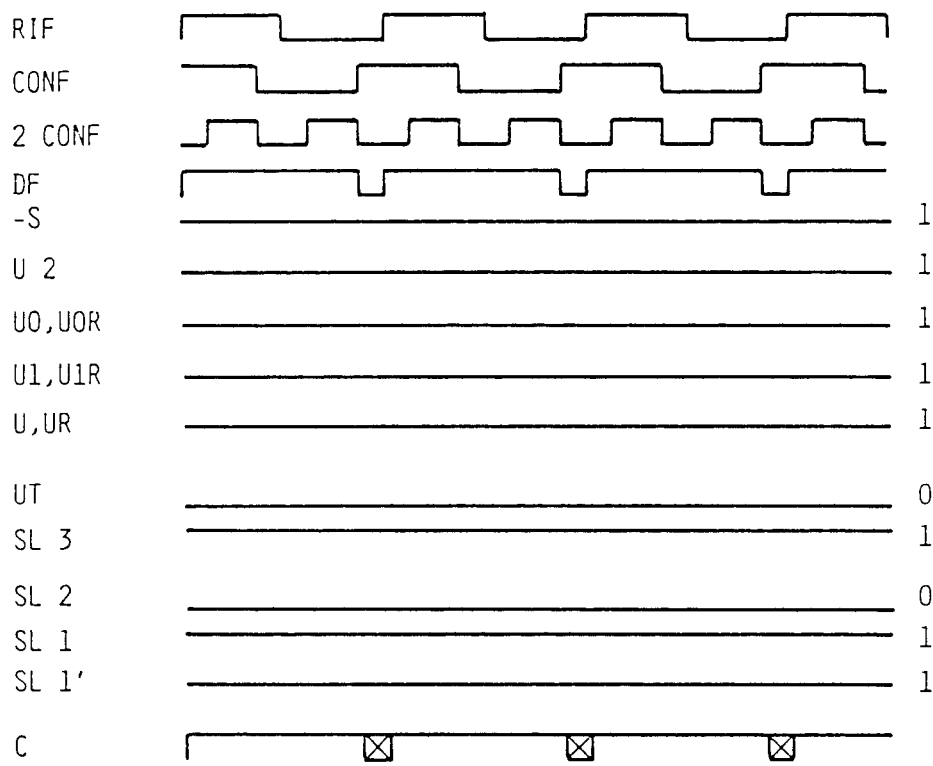

PHASE-FREQUENCY COMPARATOR FOR PHASE-LOCKED LOOPS

SUMMARY

An instantaneous comparison unit and an associated sequential state logic circuit make it possible to maintain a condition of phase locking with a reference signal, remaining immune to disturbances which cause losses or additions of signal fronts. Continuous phase shifting conditions during the transient which precedes locking are recognized and compensated for.

DESCRIPTION

The present invention relates to a phase-frequency comparator for phase-locked loops.

In centralized digital systems, such as for example digital technique telephone switching systems phase-locked loops are used to locally regenerate the cadence or main clock signal which has the function of synchronizing the entire system in the various modules or operative units.

Correct synchronization requires between the main clock signal and the regenerated signal a fixed phase relationship, generally zero.

For this purpose the phase-locked loops include a phase-frequency comparator which compares the main or reference clock signal with a regenerated or comparison signal generated locally by a voltage controlled oscillator (VCO), taking from the comparison the information related to the phase difference between the two signals and the correction sign to be introduced to cancel out said difference.

It is naturally important that during the initial transient which precedes accomplishment of the locking the sign information be generated correctly and continue unchanged despite the continuous shifting of the phase in such a manner as to allow the local oscillator to shift progressively toward the desired frequency. This applies in particular to the so-called VCXO oscillators, i.e. quartz crystal oscillators which because of unavoidable ageing phenomena in the quartz see their nominal frequency shift from a central position toward one end or the other of their characteristic curve, which gives the frequency versus of the control voltage, and thus require the use of a comparator capable of maintaining the correction sign indefinitely.

It is also important that once the phase difference has been cancelled the loop remain locked to phase zero.

It is also known that the reference signal can contain spurious transitions represented by additional fronts due to disturbances or events of various kinds or by missing fronts, lost following failures or reconfigurations.

In presently known phase-frequency comparators e.g. those illustrated on page 224 of the book "Digital PLL Frequency Synthesizers" by Ulrich L. Rohde, published by Prentice-Hall Inc. in 1983, said spurious transitions are the source of losses of locking and regenerated signal shifting.

This occurs because whereas in normal operation and even in the initial locking transient in response to a phase shift detected between the reference signal front and the regenerated signal front known comparators generate and memorize a sign information which is given by the priority of one of the two fronts in relation to the other and constantly recalls the regenerated signal toward a phase locking condition; in the presence of a spurious transition in the reference signal the sign information can be inverted, subsequently remaining memorized in the inverted state and thus bringing about a shifting or slipping of the regenerated signal phase until locking with the adjacent front, i.e. up to $\pm 2\pi$.

It is clear that said shifting of $2\pi$ causes loss of synchronism of the system which sends the reference signal with the one which receives it, since, at the end of the shifting, the regenerated local signal has lost or gained one period in relation to the reference signal. The result is that all the counters of the receiving system are out of phase in respect to the main clock.

The object of the present invention is to accomplish a phase-frequency comparator for phase-locked loops which would have the ability to never lose the locking to the reference signal front once having acquired it, in whatever operating condition and in the presence of whatever disturbance (added or missing front) on the reference signal.

Another object of the present invention is to accomplish a phase-frequency comparator which would permit the local oscillator, even if the VCXO type, to achieve without problems the initial phase locking condition.

Another object of the present invention is to accomplish a phase-frequency comparator which would also be conceived in such a manner as to not create design restrictions in the loop transfer function.

In accordance with the invention said objects are achieved with a phase-frequency comparator for phase-locked loops characterized in that it comprises an instantaneous comparison unit capable of periodically detecting the difference of phase between a reference signal and a comparison signal and producing at each detection an information associated with said phase difference and an information associated with the correction sign to be introduced, a sequential state logic circuit capable of detecting the magnitude and the sign of said phase difference and producing and memorizing a corresponding magnitude information and phase difference sign, and a selection logic controlled by said sequential state logic circuit in such a manner as to generate a correction signal of constant sign such as to cancel out the phase difference sensed if said phase difference is of magnitude greater than a predetermined value and a sign correction signal variable with said comparison unit sign information if the magnitude of said phase difference is less than said predetermined value.

In other words, the instantaneous comparison unit is capable of generating the phase difference and sign information necessary to make the normal corrections in case of small phase oscillations around the locking condition, proving then to be immune to disturbances thanks to its characteristics of periodic updating of the information on the priority of the fronts of the two signals.

Said comparison unit would not be in itself capable of operating correctly in case of continuous shifting of the comparison signal because the sign information generated by it changes when the phase, during the shifting, exceeds $\pm \pi$. A steady and unambiguous recall to the phase locking condition is thus lacking and for the same reason the initial locking becomes uncertain, especially in the case of use of a VCXO local oscillator.

To meet this requirement there is provided the sequential state logic circuit which, through recognition of a sequence of states of the phase difference and sign information, is capable of extending them to the phase difference intervals included between $-2\pi$ and $-90$, and between $+\pi$ and $+2\pi$, allowing the selection circuit to generate a sign correction signal, this time lasting, appropriate to the direction of shifting detected. In this manner the comparison signal is continuously activated toward the phase locking condition, making possible the initial locking in any shifting condition, even in case of use of a VCXO oscillator requiring to be driven up to the limit of its characteristic curve.

Figure 4:
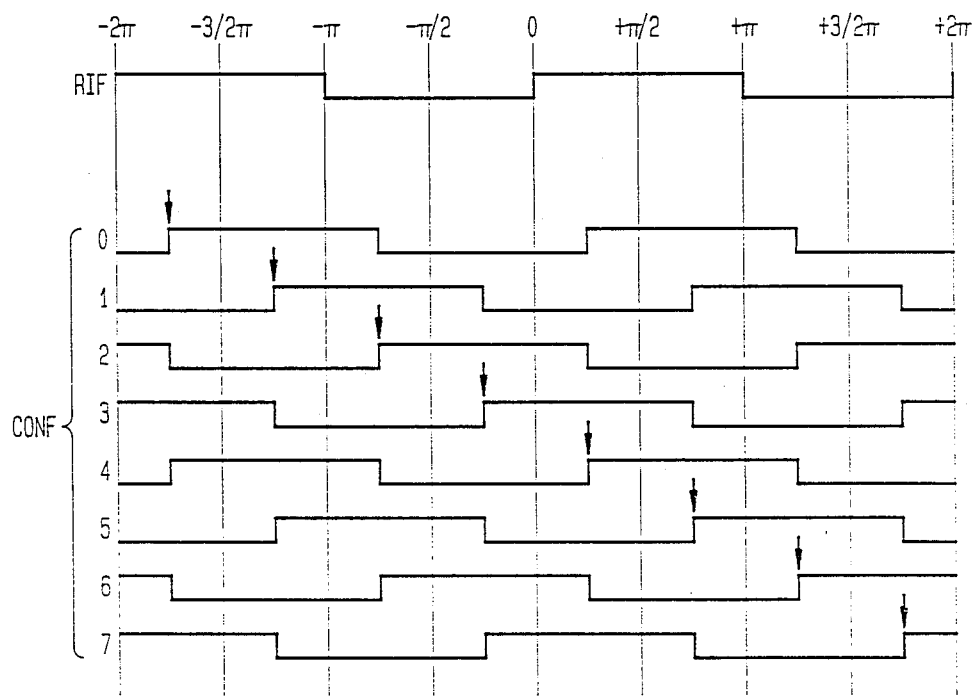
Figure 2:
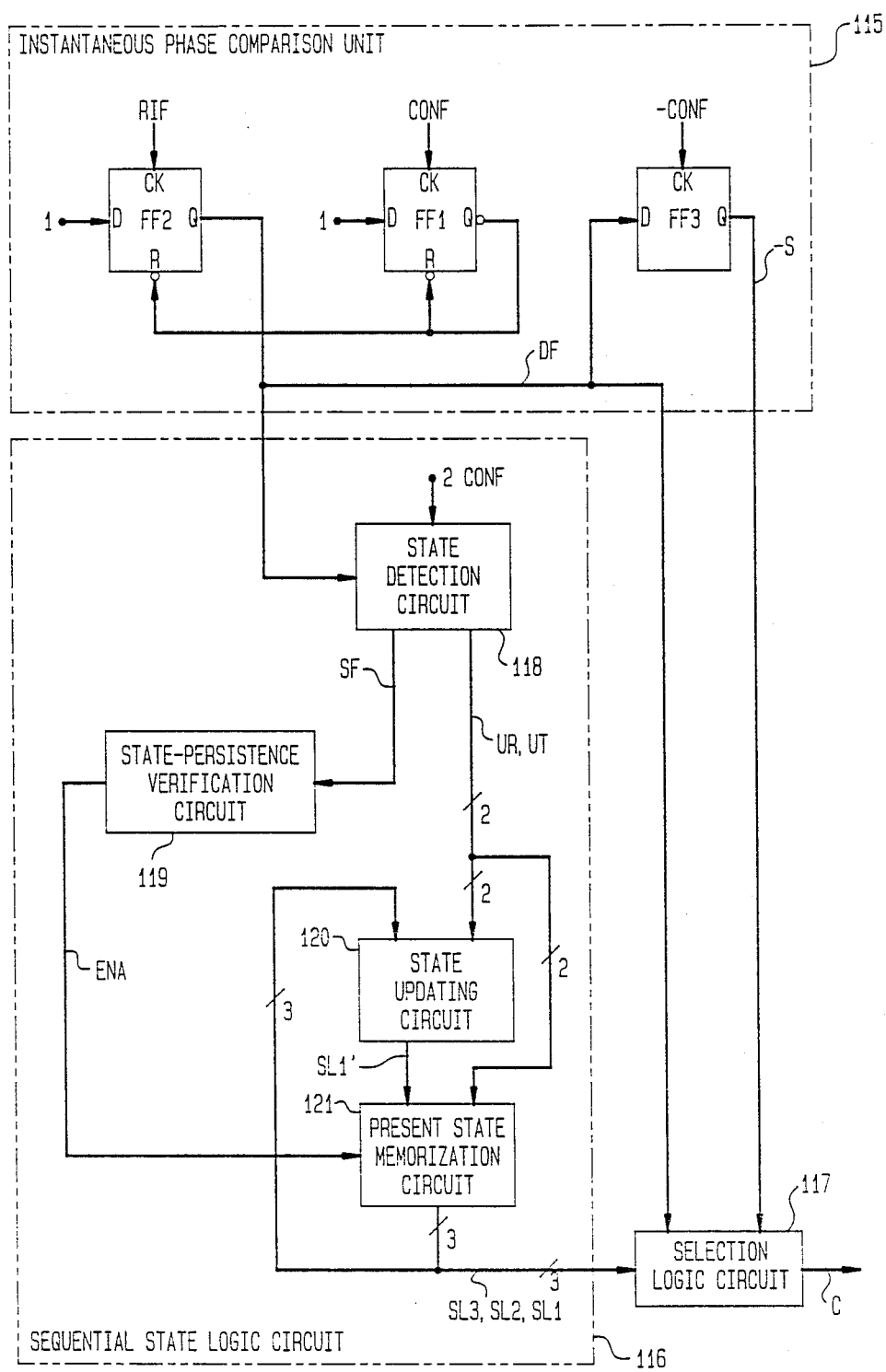
Figure 3:
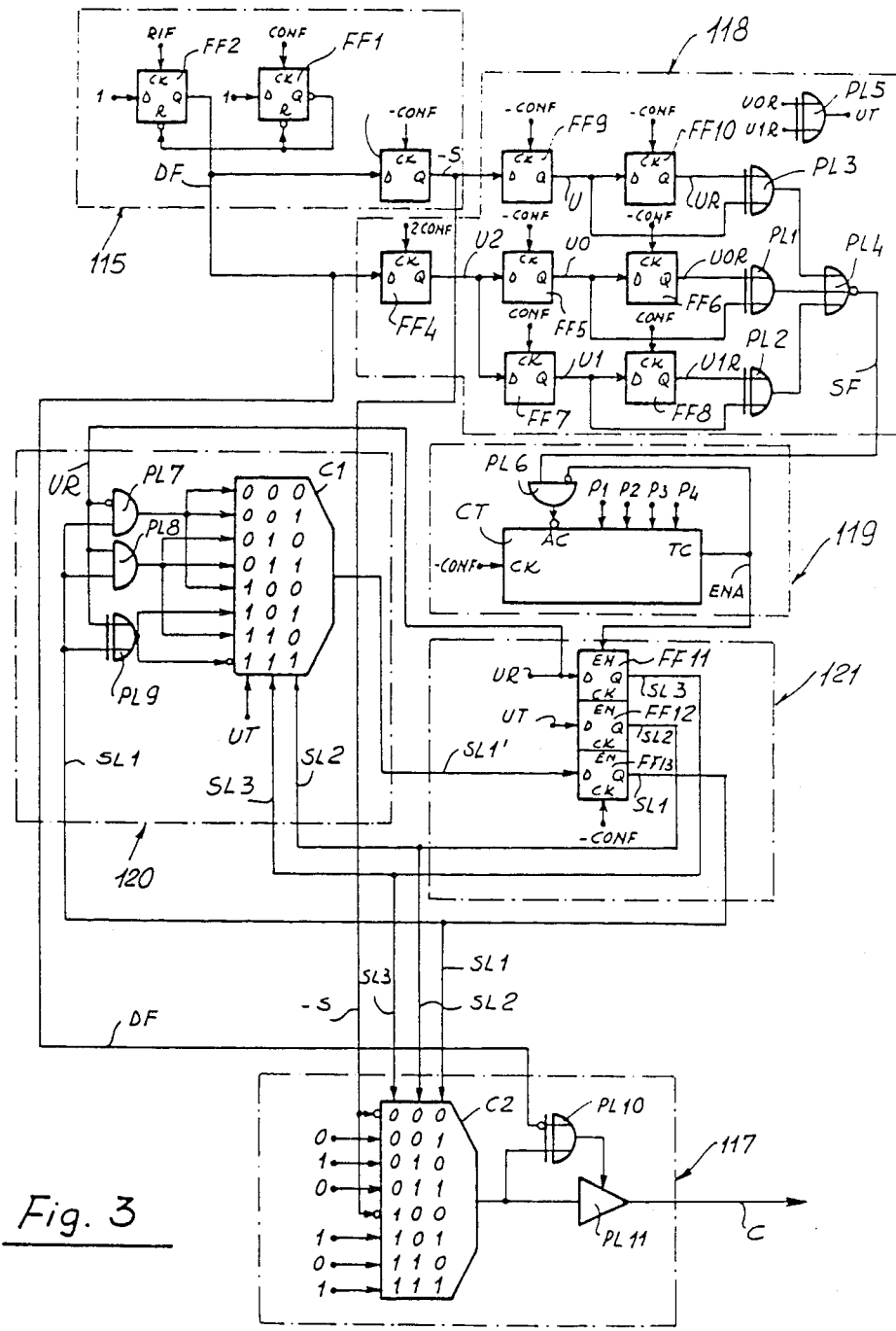
Figure 5:
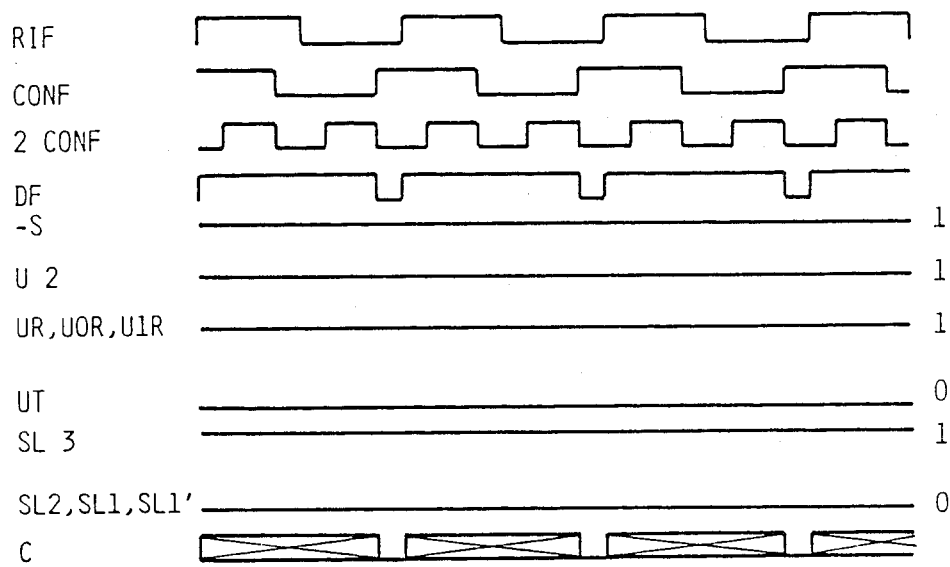
Figure 7:
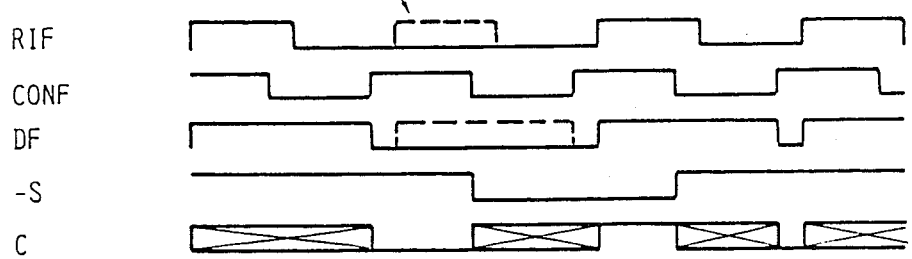
Figure 6:
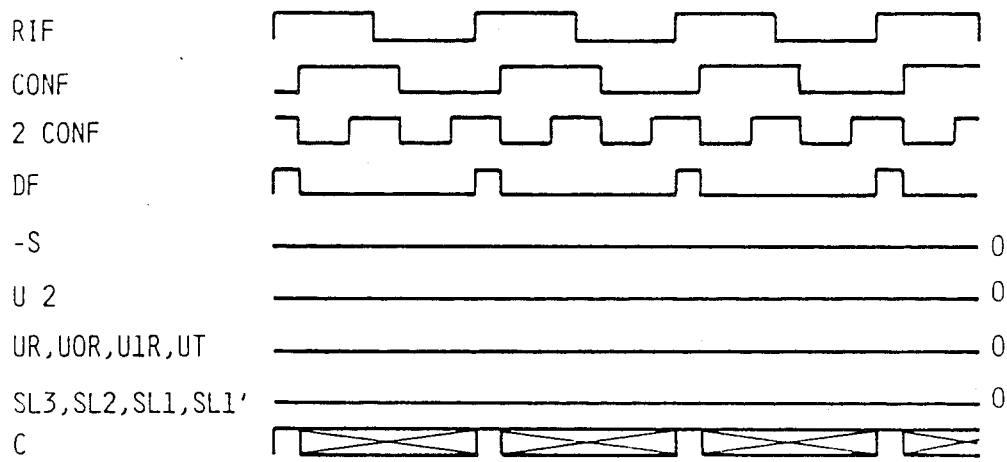
Figure 8:
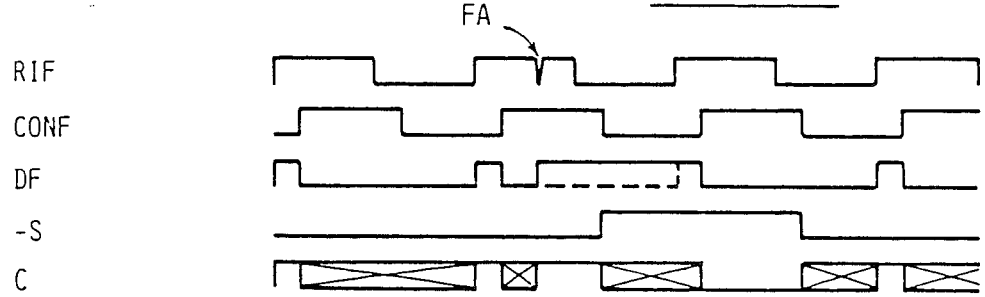
Figure 9:
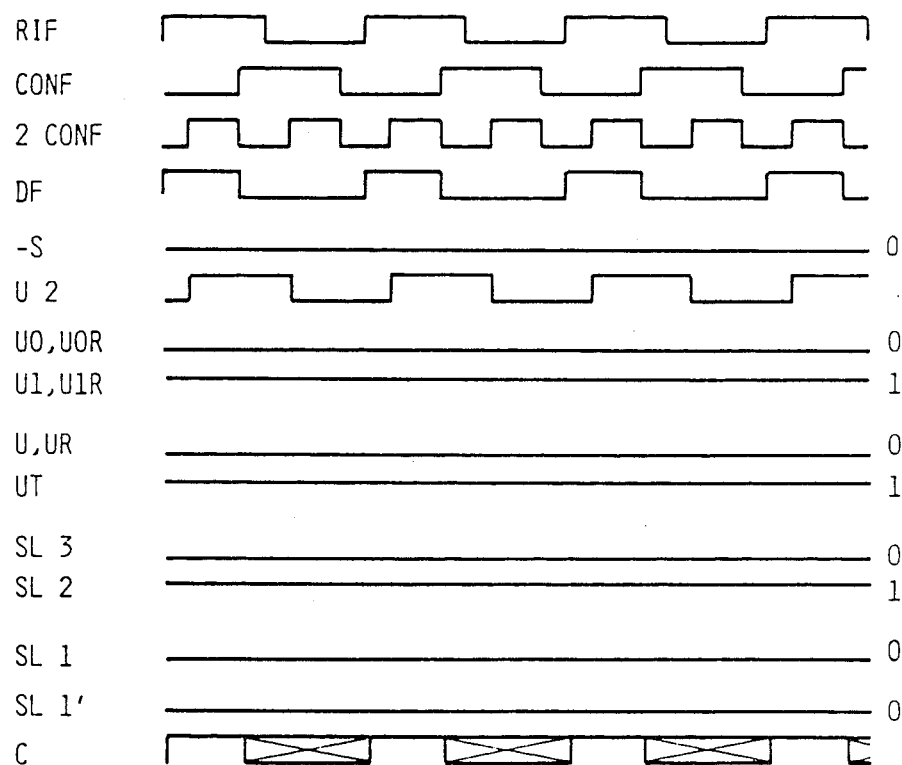

The characteristics of the present invention will be made clearer by the following detailed description of a practical implementation illustrated as an example in the annexed drawings wherein:

FIG. 1 shows the general diagram of a phase-locked loop for a digital system,

FIG. 2 shows a block diagram of the specific embodiment of a phase-frequency comparator in accordance with the invention for a phase-locked loop such as shown in FIG. 1, FIG. 3 shows the same comparator in a more detailed diagram in an example of an implementation, FIG. 4 shows an overall view of the various phase shift conditions of the loop system corresponding to the states of the sequential state logic circuit included in the comparator of FIGS. 2 and 3, FIGS. 5 and 6 show the wave forms present at various points of the comparator of FIG. 3 when the loop is in near to 0 phase locking conditions, respectively phase lead and delay, FIGS. 7 and 8 show the same wave forms as FIGS. 5 and 6 in the presence of disturbances made up of lost fronts and added fronts respectively, and FIGS. 9, 10 and 11 show the wave forms present at various points of the comparator of FIG. 3 in the case of delay shifting of the comparison signal in relation to the reference signal.

With reference to FIG. 1 a phase locked loop is shown comprising a phase-frequency comparator 111, an integrator 112, a voltage controlled oscillator (VCO) 113 and an optional frequency divider 114. The phase frequency comparator 111 compares the phase and frequency of a CONF comparison signal with a reference signal RIF constituting the main clock signal and generates an error or correction signal C made up of voltage pulses the duration of which is dependent on the phase difference between the two compared signals and the polarity of which is dependent on the sign of the said phase difference. The integrator 112 converts said pulses into a corresponding continuous voltage value. The oscillator 113 generates a regenerated square wave signal RG the frequency of which depends on the voltage applied. The divider 114 reduces the frequency of said square wave signal if said wave is a multiple of the reference signal RIF wave.

In accordance with the present invention the phase-frequency comparator 111 is made in the manner illustrated in FIG. 2, i.e. it comprises a comparison unit with periodic repeated verification 115 and a sequential state logic circuit 116 which converge in a selection logic 117 from which is taken the correction signal C.

The comparison unit 115 can be described as an instantaneous comparator because in it the information on the priority of the fronts and hence of the correction sign to be applied is periodically updated upon each comparison of the regenerated signal with the reference signal. In this manner an erroneous information deriving from a spurious transition acts on the loop only for one period of the comparison frequency and can thus be filtered by the integrator 112 without having practical effects on the condition of the regenerated signal locking.

As shown in FIG. 2 the comparison unit 115 comprises three multivibrators or flip-flops FF1, FF2 and FF3. The flip-flop FF1 has a datum input continuously fed with a logic level "1", a "clock" or cadence input CK fed with a comparison signal or frequency CONF, a inverted "reset" or zeroing input R and a inverted output Q connected to the reset input R. The flip-flop FF2 has a datum input D continuously fed with a logic level "1", a clock input CK fed with a reference signal or frequency RIF, a reversed reset input R connected with the output Q of the flip-flop FF1 and an output Q, on which is available the information DF associated with the phase difference detected. The flip-flop FF3 has a datum input D connected with the ouput Q of the flip-flop FF2 and hence fed with a phase difference signal DF, a clock input CK fed with a inverted comparison signal $-$CONF and an output Q, on which is available with a reversed sign the information S associated with the correction sign to be applied.

The sequential state logic circuit 116 has the function of recognizing, the information produced by the comparison unit being equal, whether the phase is within the interval $-\pi$ and $+\pi$, or between $-2\pi$ and $-\pi$, or between $+\pi$ and $+2\pi$. In addition, as will be seen below it has the function of reconfiguring the system in the locked condition after any phase jump of the reference signal which could occur for example in case of failures or reconfigurations.

As shown in FIG. 2 the sequential state logic circuit 116 comprises a physical state detection circuit 118, a confirmation circuit 119, a combinatory logic 120, and a memorization circuit for the present logic state 121.

The physical state detection circuit 118 has the function of distinguishing between four possible physical states of the system, corresponding to phase differences between $-\pi$ and $-\pi/2$, between $-\pi/2$ and 0, between 0 and $+\pi/2$, between $+\pi/2$ and $+\pi$, as will be better explained below. For this purpose it uses a sampling frequency 2 CONF double that of the comparison signal CONF and generates a 2-bit output signal UR, UT corresponding to the physical state detected and an output signal SF which signals the persistence of UR, UT.

As shown in FIG. 3 the physical state detection circuit 118 comprises a flip-flop FF4 having a datum input D fed with the phase difference signal DF, a clock input CK fed with a signal 2 CONF having frequency double that of the comparison signal CONF (obtainable from the frequency divider 14 or, if there is no divider, through monostable multivibrators or delay lines) and an output Q. On said output Q is available a datum signal U2 which reaches the datum inputs D of two flip-flops FF5 and FF7 followed by flip-flops FF6 and FF8 respectively. The flip-flops FF5 and FF6 are controlled by the frequency $-$CONF and their output signals UO and UOR feed the inputs of an exclusive $-$OR logic gate PL1. The flip-flops FF7 and FF8 are controlled by the frequency CONF and their ouput signals U1 and U1R feed the inputs of another exclusive $-$OR logic gate. The two inputs of another exclusive $-$OR logic gate PL3 are reached by the output signals U and UR of two more cascaded flip-flops FF9 and FF10 which are controlled at $-$CONF frequency. The flip-flop FF9 is fed by the comparison unit 115 with the reversed sign signal −S and produces the ouput signal U with which is fed the flip-flop FF10. The outputs of the logic gates PL1, PL2 and PL3 are connected with the inputs of an NOR logic gate PL4 on whose output is available the signal SF. A logic gate PL5 generates a signal UT as exclusive −OR of UOR and of U1R.

The confirmation circuit 119 has the function of preventing any changes of state due to transient disturbances from being interpreted as the actual states of the system. For this purpose the confirmation circuit 119 verifies the permanence of the SF signal in the active state, giving consent for memorization in the memorization circuit 121 only to the physical states which persist for a number of periods of the comparison signal CONF equal to or greater than a preset As shown in FIG. 3 the confirmation circuit 119 comprises a 4-bit digital counter CT which has a clock input CK fed with a frequency signal −CONF, a inverted load enable input AC fed by the inverted output of an AND logic gate PL6, four presetting inputs P1, P2, P3 and P4, and a terminal count output (TC) connected to a inverted input of logic gate PL6. Another input of logic gate PL6 is connected to the output of logic gate PL4 and thus receives signal SF.

The memorization circuit of the present logic state 121 has the function of memorizing the present logic state, updating it with the physical state data sensed by the circuit 118 and confirmed by the circuit 119, all of which is under the control of the combinatory logic 120.

As shown in FIG. 3 the memorization circuit 121 comprises three flip-flops FF11–FF13 controlled by frequency −CONF. The first flip-flop FF11 has datum input D fed with the signal UR of the detection circuit 118; another load enable input EN of the same flip-flop receives in turn the enabling signal ENA available at the ouput TC of the counter CT. The flip-flop FF12 has input EN fed in the same manner and input D fed with the signal UT of the detection circuit 118. Flip-flop FF13 has input EN fed again in the same manner and input D fed with a signal SL1′ coming from the combinatory logic 120. At the ouputs of flip-flops FF11–FF13 are available respective logic state signals SL3–SL1.

The combinatory logic 120 operates in conjunction with the detection circuit 118 and with the memorization circuit 121 to update the logic state of said memorization circuit 121 after arrival of the enabling of the confirmation circuit 119.

As shown in FIG. 3 the combinatory logic 120 comprises a selection circuit or multiplexer C1 with eight inputs addressable by means of three control bits consisting of the output UT of the detection circuit 118 and the outputs SL2 and SL3 of the memorization circuit 121. The selection circuit C1 operates in union with two AND logic gates PL7 and PL8 and an exclusive −OR logic gate PL9 to take from detection circuit 118 and memorization circuit 121 the data to be combined to produce the necessary updating datum SL1′ for the output SL1 of said memorization circuit 121. The selection circuit C1 is use as a logic element which, together with the other logic gates of the combinatory logic 120, achieves in the desired manner the updating datum generation function SL1′.

It is also shown in FIG. 3 that the selection logic 117 comprises a selection circuit or multiplexer C2 with eight inputs addressable by means of three control bits, consisting of the ouput signals SL3, SL2 and SL1 of the memorization circuit 121. The selection circuit C2 is fed at its inverted inputs by the sign signal −S and at its inverted inputs by two constant level signals 0 and 1. The output of the selection circuit C2 which, differently from C1 is really used as a selector, is connected to an exclusive−OR logic gate PL10, at another input of which is fed in inverted mode the phase difference signal DF generated by the comparison unit 115. The output of the logic gate PL10 controls a three-state logic gate PL11 which has its input connected to the output of the selection circuit C2 and outputs the correction signal C.

To understand the manner of operation of the phase frequency comparator illustrated in FIGS. 1-3 observe FIG. 4, which shows the range of variability of the phase difference which is divided in amplitude intervals $\pi/2$, from 0 to $-2\pi$ and from 0 to $+2\pi$.

The reference front of the signal CONF, indicated with an arrow, occupies successively the positions indicated with 3, 2, 1 and 0 during an elongation of $2\pi$ leftward (viewing FIG. 4) starting from phase 0, and the positions indicated with 4, 5, 6 and 7 during an elongation of $2\pi$ rightward starting from the phase 0.

It is observed that the square wave marked 0 is physically identical with the square wave marked 4 and so on for the other pairs 1-5, 2-6, 3-7.

It can be seen from FIG. 3 that the physical state detection circuit 118 operates without memory of preceding states of the system; it is therefore capable of distinguishing only between the states which cover the range of variability of the phases $-\pi$ to $+\pi$ (the other states appearing at that moment as identical) and associates in a single state those related to waves with coinciding fronts (or situated in the same interval), i.e. 2 and 6, 3 and 7, 4 and 0, 5 and 1.

In the comparator shown in FIGS. 2 and 3 the various physical states are codified by means of the two bits UR, UT in the manner shown in Table 1, below.

In the memorization circuit 121 which gives the present logic state of the system the two bits UR, UT become after confirmation SL3 and SL2. Said circuit is capable by means of the combinatory logic 120 of associating with SL3 and SL2 a third bit SL1 which, on the basis of the physical states through which the system passes successively, permits distinguishing logically a phase shift between $-\pi$ and $+\pi$ from a phase shift between $-2\pi$ and $-\pi$, or between $+\pi$ and $+2\pi$. The signal SL1 contains thus the information associated with the detected phase difference magnitude.

The signal SL1 is taken to logic level "1" each time that during a leftward phase elongation the phase difference exceeds $-\pi$ and each time that during a rightward elongation the phase difference exceeds $+\pi$. It is brought back to "0" when the crossing of the thresholds $-\pi$ and $+\pi$ occurs in the opposite direction, i.e. from phase differences greater than $\pm\pi$ toward phase differences smaller than $\pm\pi$. It is also brought back from "1" to "0" when the phase difference after reaching the value of $-2\pi$ or $+2\pi$ increases again until it exceeds said values; in this change memory of the previous states of the system is lost, and the phase is measured starting from a reference front of the signal RIF adjacent to the previous one.

The correspondence of the physical states from 0 to 7 of the system to the logic levels of the signals SL3, SL2, SL1 is illustrated in Table 2.

TABLE 1

| STATES | UR | UT |
|---|---|---|
| 2 and 6 | 1 | 1 |
| 3 and 7 | 1 | 0 |
| 4 and 0 | 0 | 0 |
| 5 and 1 | 0 | 1 |

TABLE 2

| STATE | SL3 | SL2 | SL1 |
|---|---|---|---|
| 0 | 0 | 0 | 1 |
| 1 | 0 | 1 | 1 |
| 2 | 1 | 1 | 0 |
| 3 | 1 | 0 | 0 |
| 4 | 0 | 0 | 0 |
| 5 | 0 | 1 | 0 |
| 6 | 1 | 1 | 1 |
| 7 | 1 | 0 | 1 |

TABLE 3

| Transition | SL3 | SL2 | UR | UT | SL1 | SL1' | COMMENTS |
|---|---|---|---|---|---|---|---|
| 1 | 0 | 0 | 0 | 0 | 0 | 0 | Continuance in state 4. |
| 2 | 0 | 0 | 0 | 0 | 1 | 1 | Continuance in state 0. |
| 3 | 0 | 0 | 0 | 1 | 0 | 0 | Right elongation. Change from state 4 to 5. |
| 4 | 0 | 0 | 0 | 1 | 1 | 1 | Return to equilibrium after left elongation. Change from 0 to 1. |
| 5 | 0 | 0 | 1 | 0 | 0 | 0 | Oscillation around equilibrium. Change from state 4 to 3. |
| 6 | 0 | 0 | 1 | 0 | 1 | 0 | Over $-2\pi$ phase difference. Change from state 0 to state 3. |
| 7 | 0 | 0 | 1 | 1 | 0 | 0 | Phase jump from state 4 to 2. |
| 8 | 0 | 0 | 1 | 1 | 1 | 0 | Phase jump from state 0 to 2. |
| 9 | 0 | 1 | 0 | 0 | 0 | 0 | Return to equilibrium after right elongation. Change from 5 to 4. |
| 10 | 0 | 1 | 0 | 0 | 1 | 1 | Left elongation. Change from state 1 to 0. |
| 11 | 0 | 1 | 0 | 1 | 0 | 0 | Continuance in state 5. |
| 12 | 0 | 1 | 0 | 1 | 1 | 1 | Continuance in state 1. |
| 13 | 0 | 1 | 1 | 0 | 0 | 0 | Phase jump from state 5 to 3. |
| 14 | 0 | 1 | 1 | 0 | 1 | 0 | Phase jump from state 1 to 3. |
| 15 | 0 | 1 | 1 | 1 | 0 | 1 | Right elongation. Change from state 5 to 6. |
| 16 | 0 | 1 | 1 | 1 | 1 | 0 | Return to equilibrium after left elongation. Change from 1 to 2. |
| 17 | 1 | 0 | 0 | 0 | 0 | 0 | Oscillation around equilibrium. Change from 3 to 4. |
| 18 | 1 | 0 | 0 | 0 | 1 | 0 | Over $+2\pi$ phase difference. Change from 7 to 4. |
| 19 | 1 | 0 | 0 | 1 | 0 | 0 | Phase jump from state 3 to 5. |
| 20 | 1 | 0 | 0 | 1 | 1 | 0 | Phase jump from state 7 to 5. |
| 21 | 1 | 0 | 1 | 0 | 0 | 0 | Continuance in state 3. |
| 22 | 1 | 0 | 1 | 0 | 1 | 1 | Continuance in state 7. |
| 23 | 1 | 0 | 1 | 1 | 0 | 0 | Left elongation. Change from 3 to 2. |
| 24 | 1 | 0 | 1 | 1 | 1 | 1 | Return to equilibrium after right elongation. Change from 7 to 6. |
| 25 | 1 | 1 | 0 | 0 | 0 | 0 | Phase jump from state 2 to 4. |
| 26 | 1 | 1 | 0 | 0 | 1 | 0 | Phase jump from state 6 to 4. |
| 27 | 1 | 1 | 0 | 1 | 0 | 1 | Leftward elongation. Change from state 2 to state 1. |
| 28 | 1 | 1 | 0 | 1 | 1 | 0 | Return to equilibrium after right elongation. Change from 6 to 5. |
| 29 | 1 | 1 | 1 | 0 | 0 | 0 | Return to equilibrium after left elongation. Change from 2 to 3. |
| 30 | 1 | 1 | 1 | 0 | 1 | 1 | Right elongation. Change from state 6 to 7. |
| 31 | 1 | 1 | 1 | 1 | 0 | 0 | Continuance in state 2. |
| 32 | 1 | 1 | 1 | 1 | 1 | 1 | Continuance in state 6. |

Table 3 shows the transitions or changes of state of the sequential logic 116 and allows more detailed examination of the various operating conditions of said logic.

In each transition the present logic state of the system, given by the signals SL3, SL2, and SL1 of the memorization circuit 121, is compared in the combinatory logic 120 with the physical state sensed by the detection circuit 118, presented in the form of signals UR, UT. The combinatory logic 120 generates the updating datum SL1' on the basis of said comparison in such a manner that a given physical state sensed by the detection circuit 118 brings about updating of the present memorized state on the basis of the identity of the latter (e.g. if the physical state sensed is the one corresponding to the logic states 6 and 2 and if the memorization circuit of the logic state is in states 7 or 5 the new logic state will be 6 while if the memorization circuit is in states 1 or 3 the new logic state will be 2). In other words, the combinatory logic 120 takes from the comparison the information associated with the phase difference sign and magnitude between the reference signal RIF and the comparison signal CONF and on the basis thereof transmits the updating datum SL1' to the memorization circuit 121.

From an examination of Table 3 it can be seen that the transitions 1, 2, 11, 12, 21, 22, 31, 32 concern continuance of the system in the present state. In these transitions the present state defined by SL3, SL2, SL1 coincides with the "next state" represented by UR, UT, SL1'.

The left elongation from 0 to $-2\pi$ is given by the succession of transitions 23, 27, 10. At this point the system may have reached equilibrium and can return to phase 0 through the transitions 4, 16, 29. But if equilibrium has not been reached the phase difference increases again until it exeeds $-2\pi$ and throught transition 6 the system returns to phase 0 in relation to the adjacent RIF front.

Similarly, the transitions 3, 15, 30 concern rightward elongation, the transitions 24, 28 and 9 return to phase 0 after elongation, and transition 18 represents return to phase 0 in relation to the adjacent RIF front after exceeding the phase difference of $+2\pi$.

The transitions 5 and 17 concern oscillation around the equilibrium position, which involves states 3 and 4.

In the reference signal RIF there can occur phase jumps. The system recognizes a phase jump as such when it is taken thereby into a state not adjacent to the one it occupied before the phase jump. A phase jump smaller than $\pi$ is not however distinguishable physically from a phase jump greater than $\pi$, which constitutes the complement of the first to $2\pi$. It is therefore necessary that the boundary conditions of the system provide that any phase jumps of the reference signal RIF fall within $-\pi$ and $+\pi$.

When the system is in phase 0, with a jump smaller than $+\pi$, it can jump from state 3 to state 5 (transition 19) or from state 4 to state 2 (transition 7). In these transitions the value of SL1 is 0 both for the initial states and for the final states and the system has correct reconfiguration.

But if the system is not in phase 0 and if the sum of the phase jump and the phase shift exceeds $+\pi$ it again becomes impossible to determine physically the final state of the system. More precisely, in these transitions the final state of SL1 is indeterminate.

For example, as can be seen in FIG. 4, if the system is in state 4, with phase shift near $+\pi/2$ with a phase jump of RIF less than $\pi$, to the left, it can end up in state 6. This phase jump is not distinguishable from a jump from 4 to 2 because the two final states have SL3, SL2 equal and SL1 opposed.

In Table 3 all the other possible phase jumps have been assigned conventionally to transitions to states having phase differences less than the starting one, placing $SL1'=0$ everywhere. In any case the transitions 8, 13, 14, 20, 25, and 26 are to be considered in relation to initial and final states of the system, which has not yet identified the reference front.

Concerning the correction sign to be given the system, it is seen from FIG. 4 that states 0, 1, 2, 3 refer to phase lead and states 4, 5, 6, 7 to phase delays.

The selection logic 117 which generates the correction signal C must therefore generate for states 0, 1, 2, 3 a logic level, e.g. logic level "0", which will inform the system that the frequency of the local oscillator 113 must be decreased in order to cancel out the phase lead and must generate the opposite logic level, i.e. "1", for states 4, 5, 6 and 7 so that the frequency of the local oscillator will be increased to cancel out the phase delay. This is assured by the selector C2 which is controlled by the signals SL1-SL3 in such a manner as to make available both said logic levels on the basis of the combination of said signals, which are variable with the present state of the system. The majority of the phase-locked loops also require that the correction be applied for a period proportional to the magnitude of the phase difference; therefore, the correction sign information contained in the signals SL1-SL3 must be combined with the information on the magnitude of the phase difference contained in the signal DF. In the selection logic 117, through the three-state logic gate PL11, the signal DF makes the correction signal C activated in every period of the standard signal CONF for the period corresponding to the distance of the fronts. In the rest of the period the signal C is placed in the third state, which is distinguished by high impedance and represented with crossed squares in FIGS. 5 to 11 so as not to contribute to modification of the output voltage of the integrator circuit 112 of the loop.

For states 3 and 4, still identified by signals SL1-SL3, the signal $-S$ produced by the comparison unit 111 is brought to input in the selector C2. This is done because in the crossing through the phase 0 point the correction sign changes and the change must be communicated to the system immediately, i.e. in the clock period in which it occurs, eliminating the delay of confirmation circuit 119 and of sequential logic circuit 116. In the continuous shifting to right and left the correction signal remains unchanged as already mentioned; in this case the correction given by $-S$ is linked with continuity with the correction given by the fixed logic levels input to the selector C2.

Examining the wave forms present at the various points of the system, FIG. 5 represents the loop of FIG. 1 in frequency locking condition, but not phase locking condition, more precisely with the standard signal CONF in phase lead in relation to the reference signal RIF. The signal DF indicates a phase difference equal to the distance between the fronts of the two signals.

The system is in logic state 3 with SL3=1 and SL2, SL1=0, and the correction sign to be applied is 0. In this case the correction to be made is indicated by the signal C and is determined by the reverse of the signal $-S$, modulated by the signal DF in the logic gate PL11 of the selection logic 117.

FIG. 6 represents the system in case of phase delay of the signal CONF in relation to the reference signal RIF. The system is in logic state 4 with SL3, SL2 and SL1=0. The correction sign to be applied is 1 and is determined by the reverse of the signal $-S$.

Under the conditions illustrated in FIGS. 5 and 6 any spurious transitions with addition or loss of signal fronts or actual phase jumps however produced do not influence the behaviour of the comparator and in particular do not cause losses of synchronism due to lead or delay shifting of the comparison signal of a reference. This can be seen in FIGS. 7 and 8 respectively where FP indicates a lost front and FA an added front.

In case of continuous shifting of the comparison signal in relation to the reference signal, as happens in the transitory state before locking, intervention of the sequential state logic circuit 116 is necessary to supply the correction outside the interval $-\pi$, $+\pi$. Supposing that this is a delay shifting, illustrated by the succession of FIGS. 9, 10 and 11, the system will pass from state 4 to state 5, characterized by SL3=0, SL2=1, SL1=0 (FIG. 9). Since in state 5 the phase shift is still less than $\pi$, the correction sign could theoretically still be given by the reverse of $-S$; in the real solution it is preferred to give it by means of a fixed logic level "1", determined by the selector C2 (FIG. 3), in such a manner as to prevent, in the subsequent change from state 5 to state 6 (FIG. 10), inversion of the correction sign during the confirmation cycles of the new state and of updating of the logic state of the system. In state 6, which is characterized by SL3=SL2=1, SL1 changes from 0 to 1, $-S$ now has the sign opposite the sign which would be necessary, and the correction sign is given by a fixed level "1" generated by the selector C2. The same situation is created after the system has changed from state 6 to state 7 (FIG. 11), wherein SL3=1, SL2=0, and SL1=1. With the subsequent exceeding of the phase difference $2\pi$ the system returns to state 4 (FIG. 6) and SL1 changes from "1" to "0", preparing the system for locking with the following reference front.

I claim:

1. A phase-frequency comparator for phase-locked loops comprising:
   means for providing an instantaneous phase comparison by periodically detecting the phase difference between a reference signal and a comparison signal and including means for producing at each detection an output signal representative of said detected phase difference and an additional output signal representative of a correction signal;
   a sequential state logic circuit means for detecting the magnitude and the correction sign of said detected phase difference and for deriving and storing data representative of the magnitude and phase difference correction sign information; and a selection logic means controlled by said sequential state logic circuit means for generating a correction signal having a constant sign, and including means for cancelling out the detected phase difference when said detected phase difference is greater than a predetermined value; and means for deriving a correction signal, whereby said correction signal sign is a function of the output of said comparison unit only when said phase difference is less than said predetermined value.

2. A comparator in accordance with claim 1 wherein said comparator includes a plurality of flip-flop circuits.

3. A comparator in accordance with claim 1 wherein said sequential state logic circuit means includes a physical state detection circuit operating at a frequency which is a multiple of said comparison signal frequency for periodically sampling the phase difference to detect one of four physical states corresponding to phase differences falling between $-\pi$ and $-\pi/2$, between $-\pi/2$ and 0, between 0 and $+\pi/2$ and between $+\pi/2$ and $+\pi$.

4. A comparator in accordance with claim 3 wherein said physical state detection circuit includes a sampling flip-flop having as an input a detected phase difference signal from said comparison circuit output.

5. A comparator in accordance with claim 3 wherein said storage circuit of said physical logic state circuit is comprised of a plurality of flip-flops.

6. A comparator in accordance with claim 3 wherein said sequential state logic circuit includes means for updating of a present logic state storage circuit only when the physical state detected is stored for a predetermined period of time.

* * * * *